(12) United States Patent
Son et al.

(10) Patent No.: US 12,272,403 B2
(45) Date of Patent: Apr. 8, 2025

(54) MEMORY DEVICE CONFIGURED TO REDUCE DEGRADATION OF ADJACENT WORD LINES AND OPERATING METHOD THEREOF

(71) Applicant: Samsung Electronics Co., Ltd., Suwon-si (KR)

(72) Inventors: Myoung-Ho Son, Gyeonggi-do (KR); Doo-Yeun Jung, Suwon-si (KR); Sung-Kwan Jung, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 198 days.

(21) Appl. No.: 17/955,733

(22) Filed: Sep. 29, 2022

(65) Prior Publication Data
US 2023/0223082 A1 Jul. 13, 2023

(30) Foreign Application Priority Data

Jan. 13, 2022 (KR) .................. 10-2022-0005440
May 10, 2022 (KR) .................. 10-2022-0057453

(51) Int. Cl.
*G11C 16/08* (2006.01)
*G11C 16/16* (2006.01)
(Continued)

(52) U.S. Cl.
CPC .............. *G11C 16/08* (2013.01); *G11C 16/16* (2013.01); *G11C 29/12* (2013.01); *G11C 16/0483* (2013.01); *G11C 2029/1202* (2013.01)

(58) Field of Classification Search
CPC ......... G11C 16/08; G11C 16/16; G11C 29/12; G11C 16/0483; G11C 2029/1202; G11C 16/3418; G11C 16/3427; G11C 17/00; G11C 29/82; G11C 2029/0409; G11C 2211/5641; G11C 11/5628; G11C 16/10; G11C 29/025; G11C 29/52; G11C 29/76; G11C 29/04
See application file for complete search history.

(56) References Cited

U.S. PATENT DOCUMENTS 4,455,495 A * 6/1984 Masuhara ................ G11C 8/10
257/E21.333
5,428,621 A * 6/1995 Mehrotra ................ G11C 29/82
714/721
(Continued)

FOREIGN PATENT DOCUMENTS

KR 10-1797565 B1 12/2017

*Primary Examiner* — Khamdan N. Alrobaie
(74) *Attorney, Agent, or Firm* — Harness, Dickey & Pierce, P.L.C.

(57) ABSTRACT

An operating method of a memory device includes: acquiring an address of a first bad word line, the first bad word line included in a plurality of word lines of the memory device; detecting whether word lines adjacent to the first bad word line are bad based on the address of the first bad word line, the word lines adjacent to the first bad word line included in the plurality of word lines; designating a first word line among the word lines adjacent to the first bad word line as a prohibited word line, the first word line being detected as a second bad word line; and sending first data via a second word line among the word lines adjacent to the first bad word line, the second word line being detected as a normal word line.

20 Claims, 14 Drawing Sheets

(51) Int. Cl.
  *G11C 29/12* (2006.01)
  *G11C 16/04* (2006.01)

(56) References Cited

U.S. PATENT DOCUMENTS

| | | | | |
|---|---|---|---|---|
| 5,986,950 A | * | 11/1999 | Joseph | G11C 29/44 |
| | | | | 365/201 |
| 8,769,356 B2 | * | 7/2014 | Yu | G11C 29/785 |
| | | | | 714/719 |
| 10,628,265 B2 | * | 4/2020 | Kim | G06F 11/1458 |
| 2014/0071756 A1 | | 3/2014 | Iwai et al. | |
| 2014/0321202 A1 | * | 10/2014 | Yang | G11C 29/804 |
| | | | | 365/185.09 |
| 2015/0003156 A1 | | 1/2015 | Berckmann et al. | |
| 2015/0117105 A1 | * | 4/2015 | Jung | G11C 16/3459 |
| | | | | 365/185.12 |
| 2016/0180936 A1 | * | 6/2016 | Choi | G11C 29/4401 |
| | | | | 365/185.12 |
| 2016/0196863 A1 | * | 7/2016 | Shin | G11C 11/406 |
| | | | | 365/222 |
| 2017/0116076 A1 | | 4/2017 | Sharma et al. | |
| 2017/0133108 A1 | * | 5/2017 | Lee | G11C 29/78 |
| 2017/0372797 A1 | | 12/2017 | Huang | |

\* cited by examiner

1st loop    2nd loop    nth loop

1st loop

MEMORY DEVICE CONFIGURED TO REDUCE DEGRADATION OF ADJACENT WORD LINES AND OPERATING METHOD THEREOF

CROSS-REFERENCE TO RELATED APPLICATION

This application claims priority to and the benefit of Korean Patent Application No. 10-2022-0005440 filed in the Korean Intellectual Property Office on Jan. 13, 2022, and Korean Patent Application No. 10-2022-0057453 filed in the Korean Intellectual Property Office on May 10, 2022, each of which are incorporated herein in their entirety by reference.

BACKGROUND

Field of the Disclosure

The present disclosure relates to a memory device and an operating method thereof.

Description of the Related Art

A memory device is a device that can record data and read the recorded data as desired. The memory device may include a nonvolatile memory (NVM), in which stored data is not destroyed even when power is not supplied, and a volatile memory (VM), in which stored data is lost when power is not supplied.

The memory device may use various wires inside to control a plurality of memory cells disposed therein. Examples of such wires include a word line and a bit line connected to a memory cell.

As the size of the memory device is gradually down-sized, the distance between the wires disposed inside the memory device also narrows.

SUMMARY

Some example embodiments provide a memory device that prevents or hinders reliability degradation of word lines adjacent to bad word lines.

Some example embodiments provide a memory device that prevents or hinders progressive degradation of word lines adjacent to bad word lines.

Some example embodiments provide a memory device with increased usable capacity.

An operating method of a memory device according to an example embodiment includes: acquiring an address of a first bad word line, the first bad word line included in a plurality of word lines of the memory device; detecting whether word lines adjacent to the first bad word line are bad based on the address of the bad word line, the word lines adjacent to the first bad word line included in the plurality of word lines; designating a first word line among the word lines adjacent to the first bad word line as a prohibited word line, the first word line being detected as a second bad word line; and sending first data via a second word line among the word lines adjacent to the first bad word line, the second word line being detected as a normal word line.

An operating method of a memory device according to an example embodiment includes: acquiring an address of a first bad word line in a block; sending first data via the first bad word line; sending second data via a word line adjacent to the bad word line; and designating the first bad word line as a prohibited word line, and designating the word line adjacent to the first bad word line as a read-only word line.

A memory device according to an example embodiment includes: a memory cell array including a plurality of memory cells respectively connected to a plurality of word lines; and a memory controller configured to acquire an address of a first bad word line in the plurality of word lines, detect whether word lines adjacent to the first bad word line are bad based on the address of the first bad word line, designate a first word line among the word lines adjacent to the first bad word line as a prohibited word line the first word line being among the word lines adjacent to the first bad word line, the first word line being detected as a second bad word line, and record data in a second word line the word lines adjacent to the first bad word line, the second word line being detected as a normal word line.

DETAILED DESCRIPTION OF THE EXAMPLE EMBODIMENTS

Figure 1:
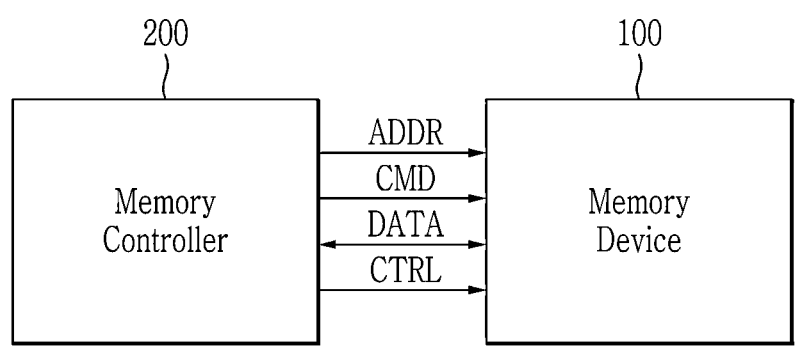
FIG. 1 is a schematic block diagram of a memory system according to some example embodiments.

In the following detailed description, only certain example embodiments have been shown and described, simply by way of illustration. As those skilled in the art would realize, the described example embodiments may be modified in different ways, all without departing from the spirit or scope of the present disclosure.

Accordingly, the drawings and description are to be regarded as illustrative in nature and not restrictive. Like reference numerals designate like elements throughout the specification. In the flowchart described with reference to the drawing, the order of operations may be changed, several operations may be merged, some operations may be divided, and specific operations may not be performed.

In the present specification, expressions described in the singular may be construed in the singular or plural unless an explicit expression such as "one" or "single" is used. In the present specification, the terms including ordinal numbers such as first, second, etc. may be used to describe various elements, but the elements are not limited by the terms. The terms are used only for the purpose of distinguishing one element from another element.

Figure 2:
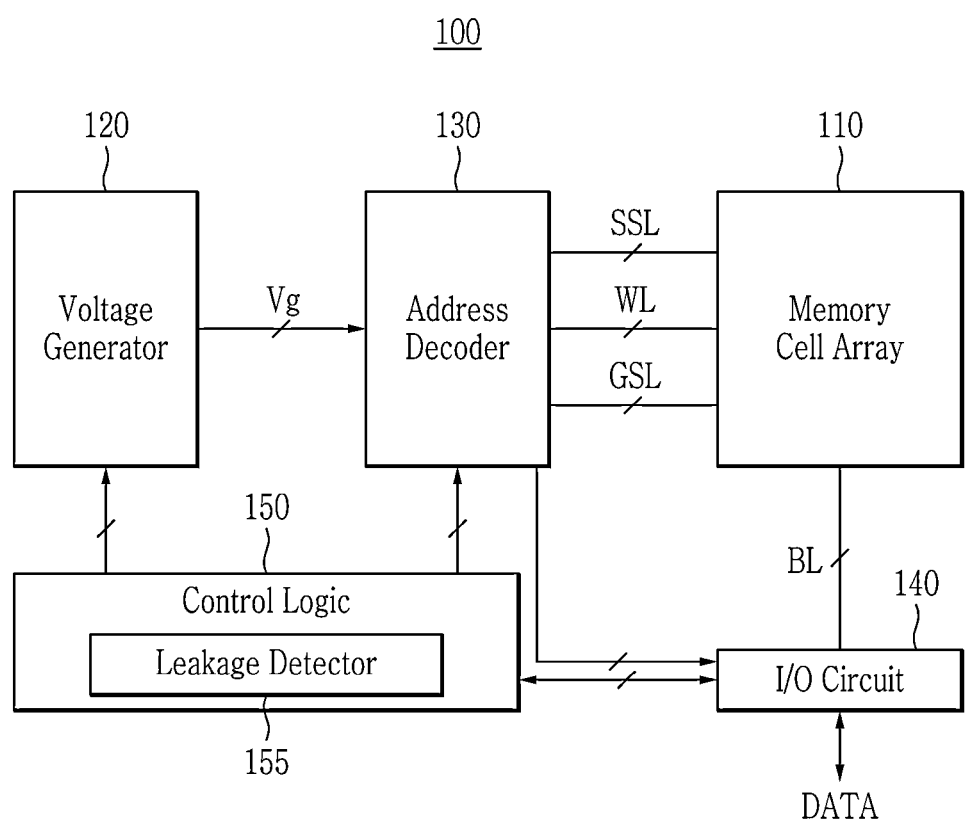
FIG. 2 is a schematic block diagram of the memory device shown in FIG. 1.
Figure 3:
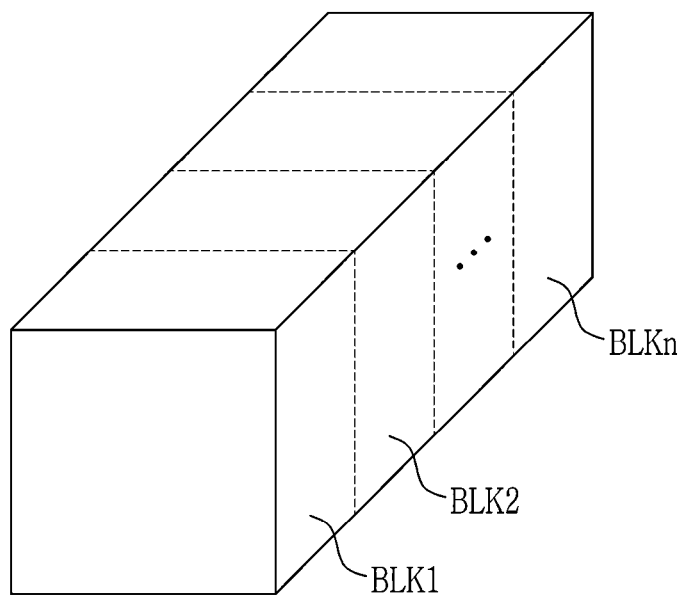
FIG. 3 is a schematic view for description of a memory cell array shown in FIG. 2.

FIG. 1 is a schematic block diagram of a memory system according to some example embodiments, FIG. 2 is a schematic block diagram of the memory device shown in FIG. 1, and FIG. 3 is a schematic view for description of a memory cell array shown in FIG. 2.

Referring to FIG. 1, FIG. 2, and FIG. 3, a memory system 10 may communicate with a host through various interfaces. The host may request a data processing operation, for example, a data read operation, a data record operation (program) operation, and a data erase operation of the memory system 10. For example, the host may be a central processing unit (CPU), a graphics processing unit (GPU), a microprocessor, or an application processor (AP).

The memory system 10 may be implemented with various types of storage devices such as a solid-state drive (SSD), an embedded multimedia card (eMMC), a universal flash storage (UFS), or a compact flash (CF), a secure digital (SD), a micro secure digital (Micro-SD), a mini secure digital (Mini-SD), an extreme digital (xD), or a memory stick. Furthermore, the memory system 10 may be implemented as a personal computer (PC) or data server, a laptop computer, or a portable device. Portable devices include mobile phones, smart phones, tablet PCs, personal digital assistants (PDAs), enterprise digital assistants (EDAs), digital still cameras, digital video cameras, a portable multimedia player (PMP), a personal navigation device or portable navigation device (PND), a handheld game console, or an e-book. In addition, the memory system 10 may be implemented as a system-on-a-chip (SoC).

The memory system 10 may include a memory device 100 and a memory controller 200.

The memory controller 200 may be configured to access the memory device 100 in response to a request from the host. The memory controller 200 may be configured to provide an interface between the memory device 100 and the host. In addition, the memory controller 200 may be configured to drive firmware for controlling the memory device 100.

The memory controller 200 may control the operation of the memory device 100. Specifically, the memory controller 200 may provide at least one of an address ADDR, a command CMD, data DATA, and a control signal CTRL along an input and output line connected to the memory device 100.

The memory controller 200 may use at least one of the address ADDR, the command CMD, and the control signal CTRL to record or erase data to or from the memory device 100 or read data from the memory device 100. The control signal CTRL may include a chip enable (CE), a write enable (WE), a read enable (RE), and the like.

The memory device 100 may be a non-volatile memory device such as a NAND flash memory, a vertical NAND (VNAND) flash memory, a NOR flash memory, a resistive random access memory (RRAM), a phase-change memory (PRAM), a magneto resistive random access memory (MRAM), a ferroelectric random access memory (FRAM), a spin transfer torque random access memory (STT-RAM), and the like.

The memory device 100 is a memory cell array 110, a voltage generator 120, an address decoder 130, an input and output circuit (I/O circuit) 140, and a control logic 150.

The memory cell array 110 may include a plurality of memory blocks BLK1 to BLKn. Each of or at least one of the plurality of memory blocks BLK1 to BLKn may be connected to the address decoder 130 through a word line WL, a string select line SSL, and a ground select line GSL, and may be connected to an input and output circuit 140 through a bit line BL.

The memory cell array 110 may include a plurality of memory cells disposed in regions where a plurality of word lines WL and a plurality of bit lines BL intersect. Each of or at least one of the memory cells may be used as a cell type such as a single level cell (SLC), a multi-level cell (MLC), a triple level cell (TLC), or a quad level cell (QLC).

The memory cell array 110 may include a non-volatile memory cell that non-volatilely stores data. For example, the memory cell array 110 may include a two-dimensional (2D) NAND memory array or a three-dimensional (3D) vertical-NAND VNAND memory array.

The voltage generator 120 may regulate a voltage signal Vg for memory operation, and may provide the voltage signal Vg to the memory cell array 160 through the address decoder 130.

The address decoder 130 may be connected to the memory cell array 110 through the word line WL, the string select line SSL, and the ground select line GSL. The address decoder 130 may decode a row address among input addresses to select the word line WL, the string select line SSL, and the ground select line GSL. The address decoder 130 may provide the voltage signal supplied from the voltage generator 120 to the word line WL.

In addition, the address decoder 130 may decode a column address among the input addresses and transmit the decoded column address to the input and output circuit 140. In an example embodiment, the address decoder 130 may include a row decoder, a column decoder, an address buffer, and the like.

The input and output circuit 140 may be connected to the memory cell array 110 through the bit line BL. The input and output circuit 140 may receive the decoded column address from the address decoder 130. The input and output circuit 140 may select a bit line BL based on the decoded column address.

The input and output circuit 140 may provide data to be recorded to the memory cell array 110 or externally provide data read from the memory cell array 110.

The control logic 150 may provide each control signal related to the memory operation to the voltage generator 120 and the address decoder 130. The control logic 150 may control the overall operation of the memory device 100. For example, the control logic 150 may control the memory device 100 using an internal control signal based on at least one of an address ADDR, a command CMD, and a control signal CTRL received from the memory controller 200.

The control logic 150 may include a leak detector 155. The leakage detector 155 may detect whether the word line WL is bad before data is recorded to the memory cell array 110 through the word line WL.

For example, the leakage detector 155 may measure a leakage current of the word line WL. The leakage detector 155 may detect whether a leakage current has occurred between a channel and the word line WL or between the word line WL and the word line WL. The leakage detector 155 may determine that the word line WL is bad when the leakage current exceeds a reference value.

The memory cell array 110 may store the address of the word line WL determined to be bad. The memory controller 200 may acquire the address of a bad word line WL from the memory cell array 110 and process the word line WL in which the leakage current has occurred. For example, the memory controller 200 may define a word line WL in which leakage current has occurred as a bad word line WL and designate it as a prohibited word line WL. The memory controller 200 may record dummy data in the bad word line WL to prevent or hinder reliability degradation of the word line WL adjacent to the bad word line WL and increase the usable capacity of the memory device 100.

Figure 4:
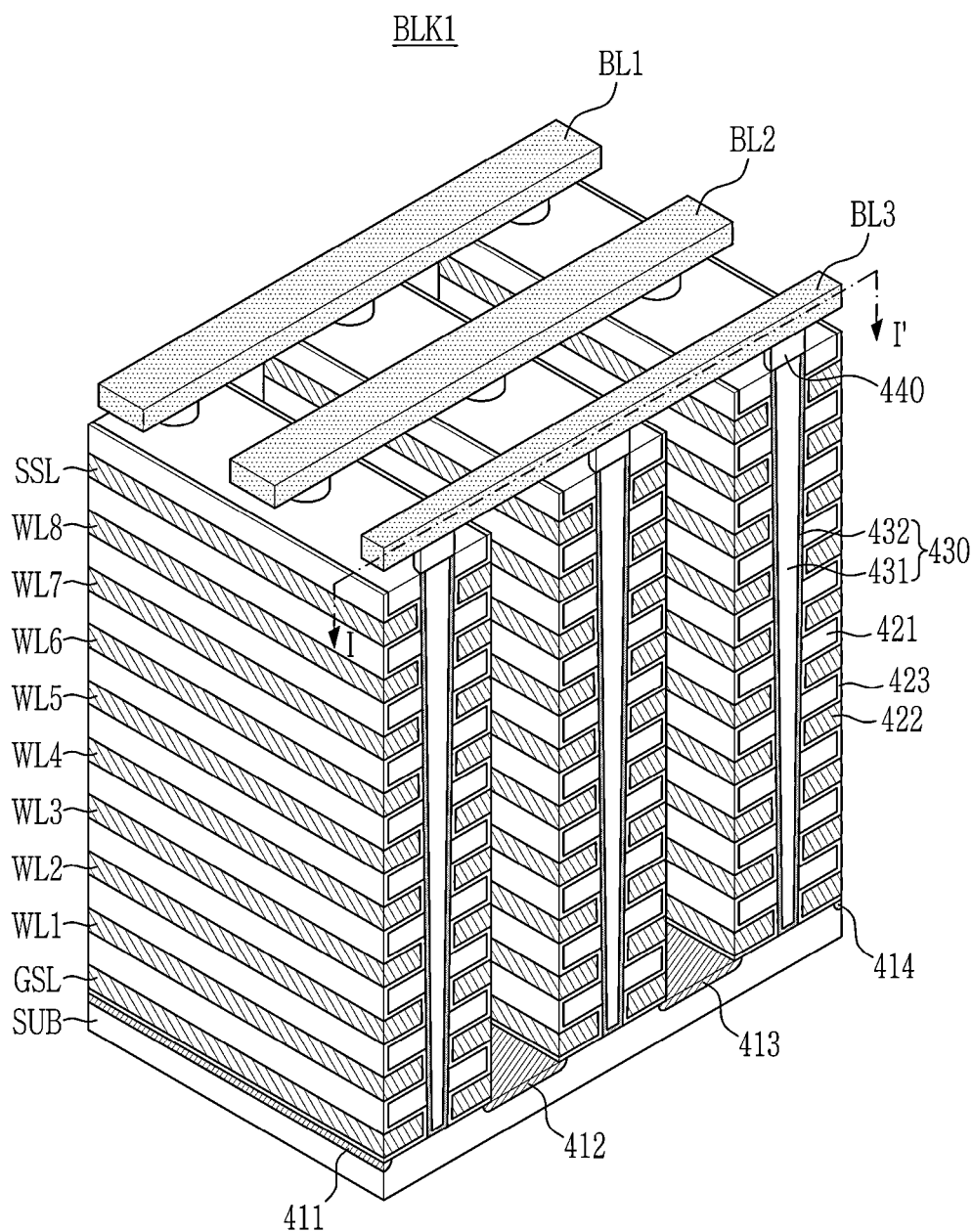
FIG. 4 is a cross-sectional view for explaining one memory block of the memory cell array.
Figure 5:
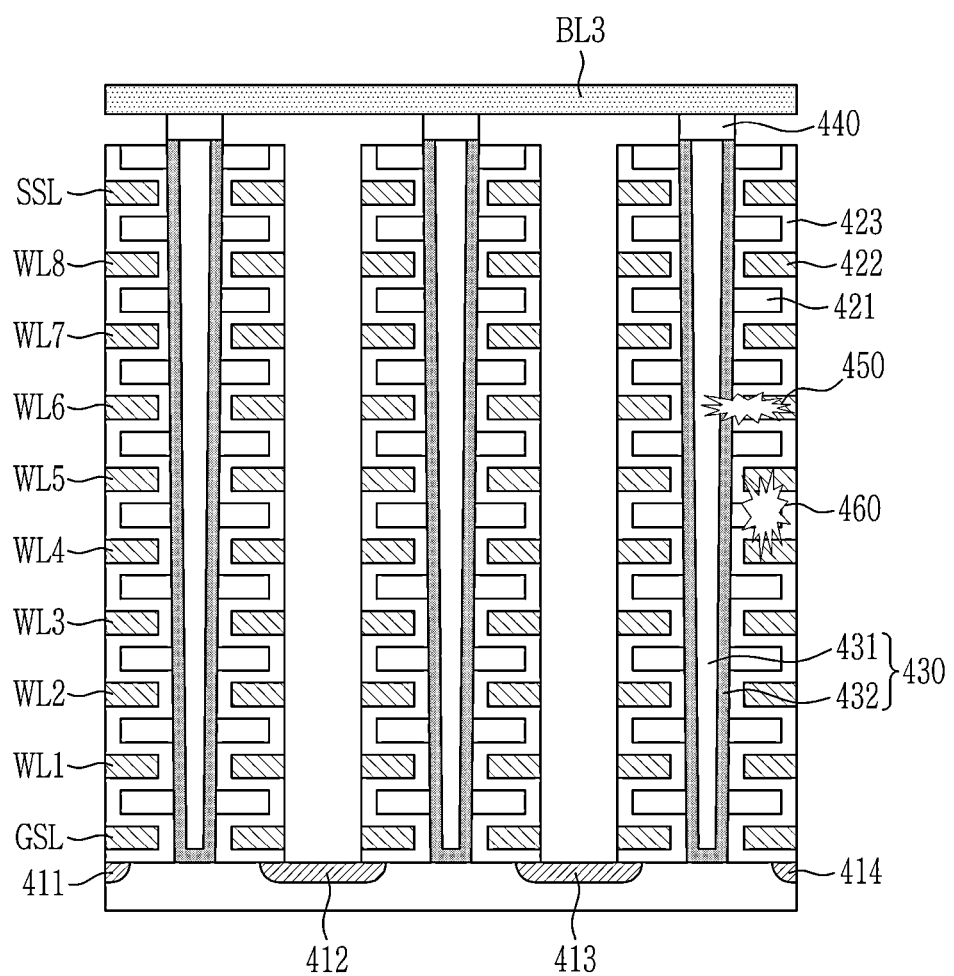
FIG. 5 is a cross-sectional view along the line I-I' of the memory block in FIG. 4.

FIG. 4 is a cross-sectional view for explaining one memory block of the memory cell array, and FIG. 5 is a cross-sectional view along the line I-I' of the memory block in FIG. 4.

Referring to FIG. 4 and FIG. 5, the memory block BLK1 may be formed in the vertical direction with a substrate SUB. The substrate SUB may be p-type silicon. The substrate SUB may include n-type doping regions 411 to 414 doped differently than the substrate SUB. Alternatively, the substrate SUB may be implemented as n-type silicon and doping regions 411 to 414 may be p-type. The doping regions 411 to 414 may represent a common source region CSR. A plurality of CSRs may be connected in common to form a common source line CSL.

An insulating material 421 and a gate electrode 422 may be alternately laminated on the substrate SUB. A data storage layer 423 may be formed between the insulating material 421 and the gate electrode 422.

A pillar 430 may penetrate the insulating material 421 and the gate electrode 422 in the vertical direction. The pillar 430 may be connected to the substrate SUB through the insulating material 421 and the gate electrode 422. The pillar 430 may be formed in a V-shape. That is, the pillar 430 may pass through the insulating material 421 and the gate electrode 422 and may become narrower as it is closer to the substrate SUB. The pillar 430 may include an inner portion 431 formed of or including an insulating material such as a silicon oxide and an outer portion 432 formed of or including a channel semiconductor.

The gate electrode 422 of the memory block BLK1 may be connected to the ground select line GSL, the word lines WL1 to WL8, and the string select line SSL. In addition, the pillar 430 may be connected to bit lines BL1 to BL3 through a drain 440. In FIG. 4 and FIG. 5, a single memory block BLK1 includes two select lines GSL and SSL, eight word lines WL1 to WL8, and three bit lines BL1 to BL3, but it is not necessarily limited thereto, and if necessary, the number of wires may be differently modified and implemented.

A defect 450 shown in FIG. 5 may be a case in which a bridge occurs between a channel and a word line. For example, in FIG. 5, it is shown that a bridge has occurred between a channel 432 and a word line WL6. In order to improve the integration of the memory cell array 110, the channels are formed deep and the gap between the channels is narrowed. In this case, a leakage current may occur between adjacent channels among channels formed vertically on the substrate SUB. In terms of semiconductor process characteristics, when the direction from the substrate SUB to the bit line is defined as upward, a channel width can be relatively increased as it is positioned more at the upper part. That is, the channel 432 may have a V-shape.

The defect 460 may be a case in which a bridge occurs between a word line WL4 and a word line WL5. For example, the defect 460 may be progressively generated due to a difference in bias between adjacent word lines during a record or read operation.

In addition, a bridge may occur in the ground select line GSL, the string select line SSL, the common source line CSL, and the like of the block BLK1, and this may be detected by a leakage detector 155.

Figure 6:
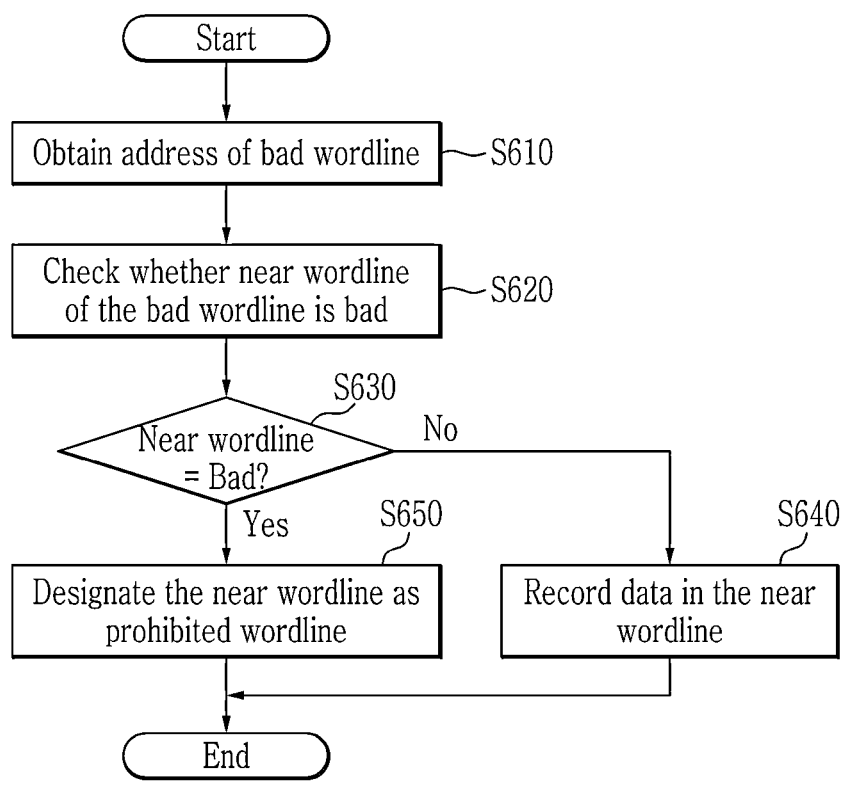
FIG. 6 is a flowchart for description of an operating method of the memory device according to some example embodiments.
Figure 7:
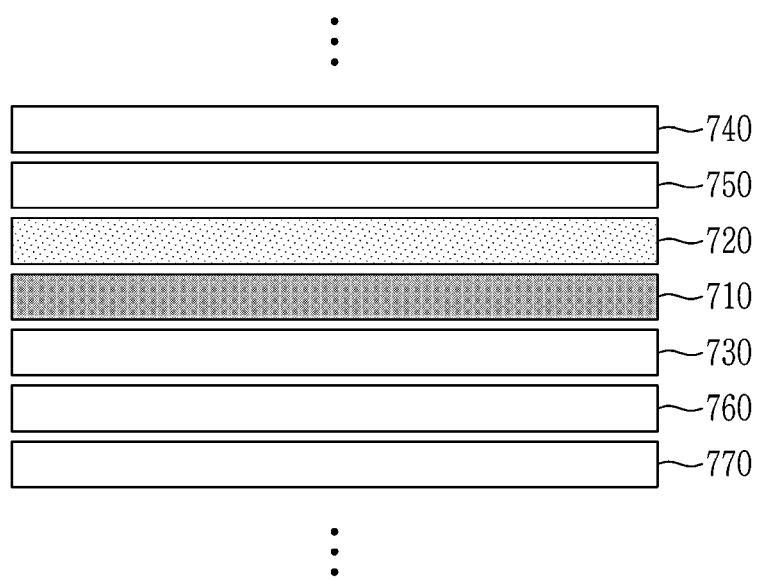
FIG. 7 schematically illustrates a plurality of word lines according to some example embodiments.

FIG. 6 is a flowchart for description of an operating method of the memory device according to some example embodiments, and FIG. 7 schematically illustrates a plurality of word lines according to some example embodiments.

Referring to FIG. 6 and FIG. 7, the memory device may acquire the address of the bad word line 710 in the block (S610). For example, a control logic of the memory device may acquire the address of the word line determined to be bad from the memory cell array storing the address of the bad word line 710. The address of the bad word line 710 may be obtained during processing of the memory device. In addition, the address of the bad word line 710 may be obtained based on the operation of the memory device performed before a block erase. For example, the memory device may detect whether a word line is bad before performing a record operation, and may store an address in case of the bad word line 710. Thereafter, although the memory device performs a record or read operation according to the instruction of the host and erases the block as necessary, the memory device may acquire the address of the bad word line 710 prior to the record operation. The memory device may not detect the bad word line 710 again.

The memory device may detect whether word lines 720 and 730 adjacent to the bad word line 710 are bad based on the address of the bad word line 710 (S620). For example, the leakage detector of the memory device may detect whether the adjacent word lines 720 and 730 are bad by detecting whether a leakage current exists in the word line. The memory device may sequentially inspect word lines 740, 750, 720, 710, 730, 760, and 770. That is, the memory device inspects the word line in the order of the adjacent word line 720, the bad word line 710, and the adjacent word line 730 for the bad word line 710 and the adjacent word lines 720 and 730, and defectiveness of the adjacent word line 720 is detected, the bad word line 710 is passed, and defectiveness of the adjacent word line 730 is detected. The memory device may not perform a read operation on the bad word line 710 that has passed. The memory device inspects the word lines 740, 750, 720, 710, 730, 760, and 770 in the reverse order as described above.

The adjacent word lines 720 and 730 may include n upper word lines and n lower word lines of the bad word line 710, where n is an integer greater than zero. n may be different depending on the process capability of a manufacturer of the memory device. For example, a manufacturer with excellent process capability may use a relatively small n compared to a manufacturer without excellent process capability. In FIG. 7, a bad word line 710 and adjacent word lines 720 and 730 in the case where n is 1 are illustrated.

The memory device determines whether the adjacent word lines 720 and 730 are bad (S630), and when the adjacent word lines 720 and/or 730 are bad, the adjacent word lines 720 and/or 730 are used as prohibited word lines (S650). The memory device may store the address of the bad adjacent word lines 720 and/or 730.

In addition, the memory device determines whether the adjacent word lines 720 and 730 are bad (S630), and when the adjacent word lines 720 and/or 730 are normal, data may be recorded in the adjacent word lines 720 and/or 730 (S640). The memory device may record data in a number of bits per cell less than the number of bits per cell used in the normal word lines 740, 750, 760, and 770 excluding the bad word line 710 and adjacent word lines 720 and 730 among the plurality of word lines. The memory device may record data in a mode corresponding to the memory cell type for the normal word lines 740, 750, 760, and 770. When the memory cell type is TLC, the memory device records data in the adjacent word lines 720 and/or 730 that are normal in an SLC mode, an MLC mode, and the like such that the stress applied to the word line is relieved and progressive degradation can be prevented or hindered. In case of the SLC mode, the memory device can record data in 1-loop.

In case of the MLC mode, the memory device may record data in k-loop.

For example, when it is detected that the adjacent word line 720 is normal, the memory device may record data to the adjacent word line 720. In addition, the memory device may detect whether another adjacent word line 730 is bad. Specifically, as a control logic of the memory device already recognizes that the bad word line 710 is bad based on the address acquired in the step S610, the word line 730 adjacent to the bad word line 710 is determined to be bad or not through the leakage detector in S620, and when the word line 730 adjacent to the bad word line 710 is determined to be bad, the control logic may store an address of the adjacent word line 730 in the memory cell array and designate the adjacent word line 730 as a prohibited word line. Thereafter, since the adjacent word line 730 becomes a bad word line, whether the adjacent word line 730 is bad or not is not determined again, and the step S630 is newly performed on the normal word line 760 and S650 or S650 may be performed according to a result of the step S630.

As another example, when it is detected that the adjacent word line 720 is bad, the memory device may designate the adjacent word line 720 as a prohibited word line and store the address of the adjacent word line 720 in the memory cell array. The memory device may record dummy data to the adjacent word line 720. Since the adjacent word line 720 became a bad word line, whether or not the adjacent word line 720 is bad is not determined again after looping, and the normal word line 750 becomes an adjacent word line to the bad word line 720, and accordingly, the operation of S640 or S650 may be performed according to the result of S630. Since the memory device already recognizes that the bad word line 710 is bad based on the acquired address, the defect detection step may be omitted. When the memory device detects that the adjacent word line 730 is normal, user data may be recorded into the adjacent word line 730. When the memory device detects that the adjacent word line 730 is bad, the memory device may designate the adjacent word line 730 as a prohibited word line.

The memory device records data to the adjacent word lines 720 and/or 730 that are normal in the SLC mode using a first voltage, and uses a second voltage to record data in the normal word lines 740, 750, 760, and 770 in the MLC mode, the TLC mode, or the QLC mode. Here, the first voltage may be lower than the second voltage, which may relieve stress applied to the word line and prevent or hinder progressive degradation. For 1-loop data recording, k-loop data recording, data recording using the first voltage, and data recording using the second voltage will be described later with reference to FIG. 12A to FIG. 13B.

The memory device may detect whether it is bad before recording (e.g., sending) data even for each of or at least one of the normal word lines 740, 750, 760, and 770.

Figure 8:
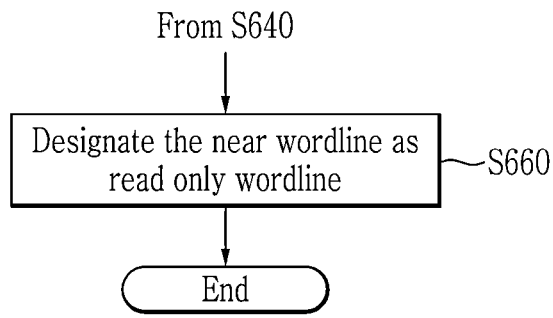
FIG. 8 a flowchart for description of an operating method of the memory device of FIG. 6.

FIG. 8 is a flowchart for description of an operating method of the memory device of FIG. 6.

Referring to FIG. 8, the memory device determines whether the adjacent word lines 720 and/or 730 are bad (S630), and when the adjacent word lines 720 and/or 730 are normal, the memory device records data to the adjacent word lines 720 and/or 730 (S640) and may designate the adjacent word lines 720 and/or 730 as read-only word lines (S660). That is, the memory device may only perform a read operation on data once written to the adjacent word lines 720 and/or 730 until the block erase operation is performed. Accordingly, it is possible to prevent or hinder progressive degradation from occurring in adjacent word lines 720 and 730.

Figure 9:
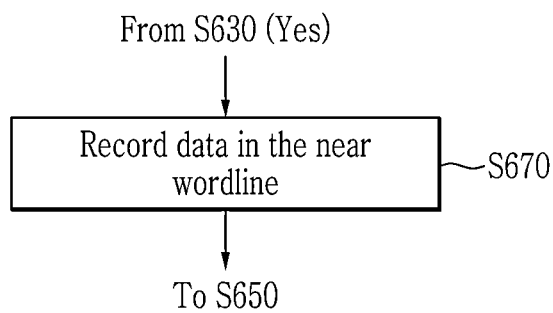
FIG. 9 is a flowchart for description of an operating method of the memory device of FIG. 6.

FIG. 9 is a flowchart for description of an operating method of the memory device of FIG. 6.

Referring to FIG. 9, the memory device determines whether the adjacent word lines 720 and 730 are bad (S630), and when the adjacent word line 720 and/or the adjacent word line 730 are bad, the memory device may record data to the bad word line (S670). In this case, the memory device may record data using a third voltage. The third voltage may be the same as the first voltage described above. The recorded data may be dummy data. Compared to a method of simply not using the bad word line, a method of not using the dummy data after recording the dummy data to the bad word line may prevent or hinder the reliability of the word line adjacent to the bad word line from being degraded. When the adjacent word line 720 and/or the adjacent word line 730 are normal, as in step S640 of FIG. 6, the memory device may record user data in a normal word line.

Figure 10:
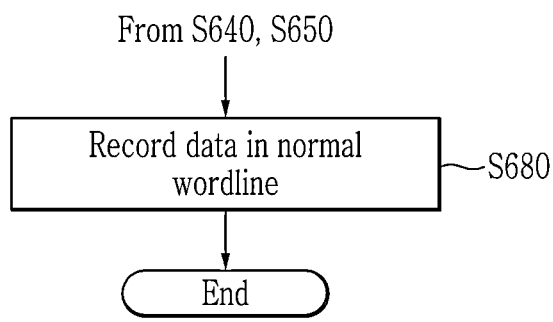
FIG. 10 is a flowchart for description of an operating method of the memory device of FIG. 6.

FIG. 10 is a flowchart for description of an operating method of the memory device of FIG. 6.

Referring to FIG. 10, the memory device may record data to the normal word lines 740, 750, 760, and 770. In this case, the memory device may use a second voltage. The second voltage may be higher than the first voltage and the third voltage. The memory device may record data to the normal word lines 740, 750, 760, and 770 in a mode corresponding to the memory cell type. For example, when the memory cell type is SLC, the memory device may record data to the normal word lines 740, 750, 760, and 770 in the SLC mode. When the memory cell type is MLC, the memory device may record data to the normal word lines 740, 750, 760, and 770 in the MLC mode. When the memory cell type is TLC, the memory device may record data to the normal word lines 740, 750, 760, and 770 in the TLC mode. When the memory cell type is QLC, the memory device may record data to the normal word lines 740, 750, 760, and 770 in the QLC mode.

The memory device records data using a data recording mode of the same level or lower than a user data recording mode used for the normal word lines 740, 750, 760, and 770 for the bad word line 710 and the word lines 720 and 730 adjacent to the bad word line 710. For example, when the memory device records data to normal word lines 740, 750, 760, and 770 in the SLC mode, the memory device record data to the bad word line 710 and adjacent word lines 720 and 730 in the SLC mode. When the memory device records data to normal word lines 740, 750, 760, and 770 in the MLC mode, data can be recorded to the bad word line 710 and adjacent word lines 720 and 730 in the SLC mode. When the memory device records data to the normal word lines 740, 750, 760, and 770 in the TLC mode, data is recorded to the bad word line 710 and adjacent word lines 720 and 730 in the SLC mode or the MLC mode. When the memory device records data to the normal word lines 740, 750, 760, and 770 in QLC mode, data may be recorded in the bad word line 710 and the adjacent word lines 720 and 730.

In FIG. 10, it is illustrated that the step S680 is performed after the step S640 and the step S650, but it is not intended to necessarily limit the order, and the step S680 may be implemented by being performed before detecting whether the bad word line is bad according to the positions of the bad word line and the normal word line in the block.

Figure 11:
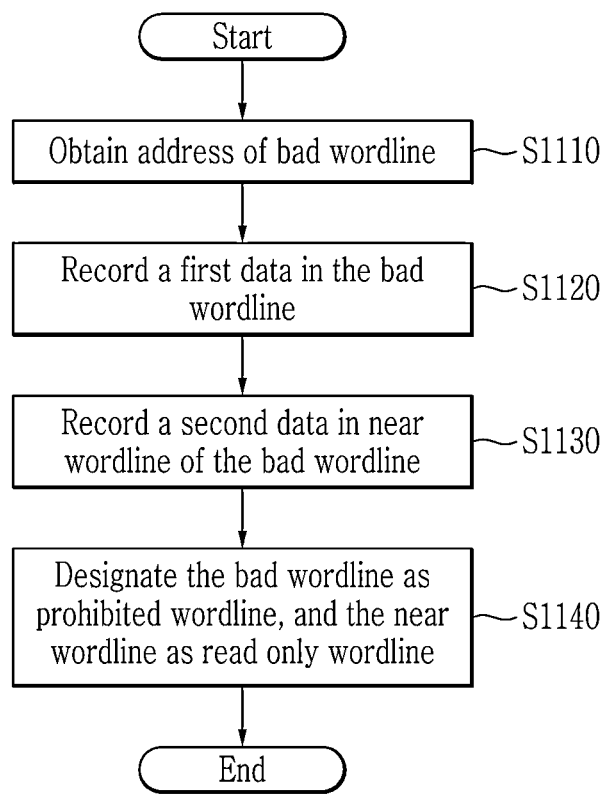
FIG. 11 is another example of a flowchart of an operating method of a memory device according to another example embodiment.

FIG. 11 is another example of a flowchart of an operating method of a memory device according to another example embodiment.

Referring to FIG. 11, a memory device may acquire an address of a bad word line in a block (S1110). The address of the bad word line may be found and stored during the process, or it may be found and stored during a bad detection process performed before a block erase operation.

The memory device may record first data to the bad word line (S1120). The memory device may record the first data to the bad word line using a fourth voltage in the SLC mode. The first data may be dummy data.

The memory device may record second data to a word line adjacent to the bad word line (S1130). The memory device may record the second data in the adjacent word line by using a fifth voltage in the SLC mode or the MLC mode. The second data may be user data, not dummy data. When the memory device records data using SLC mode, the fourth voltage may be the same as the fifth voltage. In addition, the memory device may record data to the adjacent word line by using the SLC mode with 1-loop. Compared to a sixth voltage used when recording data to a normal word line (e.g., sending data via a normal word line) that is neither a bad word line nor an adjacent word line among word lines in the block, the fourth voltage and the fifth voltage may be lower than the sixth voltage. The memory device may record data to the normal word line in a mode corresponding to the memory cell type. The mode corresponding to the memory cell type may include the SLC mode, the MLC mode, the TLC mode, and the QLC mode.

The memory device may designate a bad word line as a prohibited word line and an adjacent word line as a read-only word line (S1140). That is, dummy data is recorded to the bad word line, but data is not read, user data is recorded to an adjacent word line, and the recorded data is not updated and can only be read until the block is erased.

Accordingly, reliability degradation and progressive degradation of the memory device may be prevented or hindered, and available capacity may be increased.

The memory device may detect a bad word line before recording data for a non-bad word line. For example, the memory device may detect whether there is a defect by detecting a leakage current of a word line. The memory device may determine a word line in which the leakage current exceeds a reference value as a bad word line.

Figure 12A:
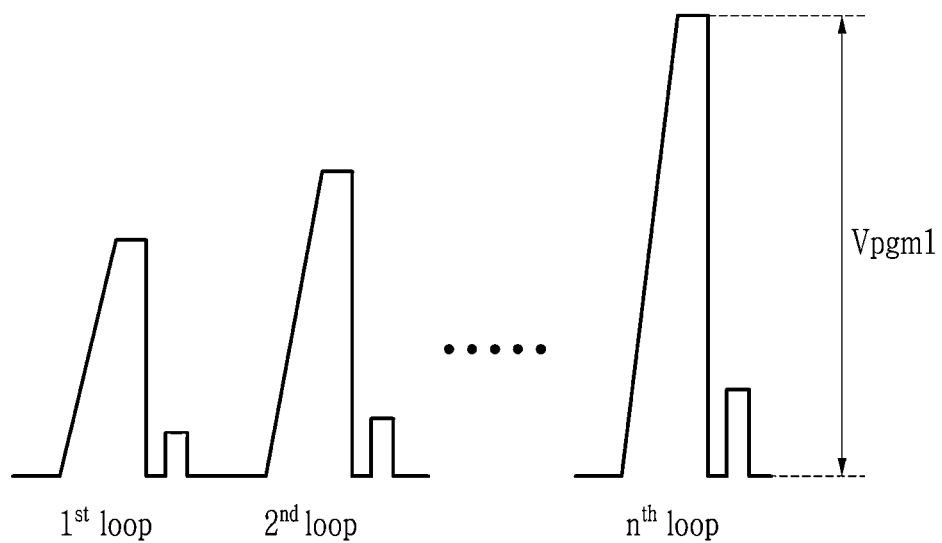
FIG. 12A is a program voltage graph for describing operation of the memory device in a normal word line according to some example embodiments.
Figure 12B:
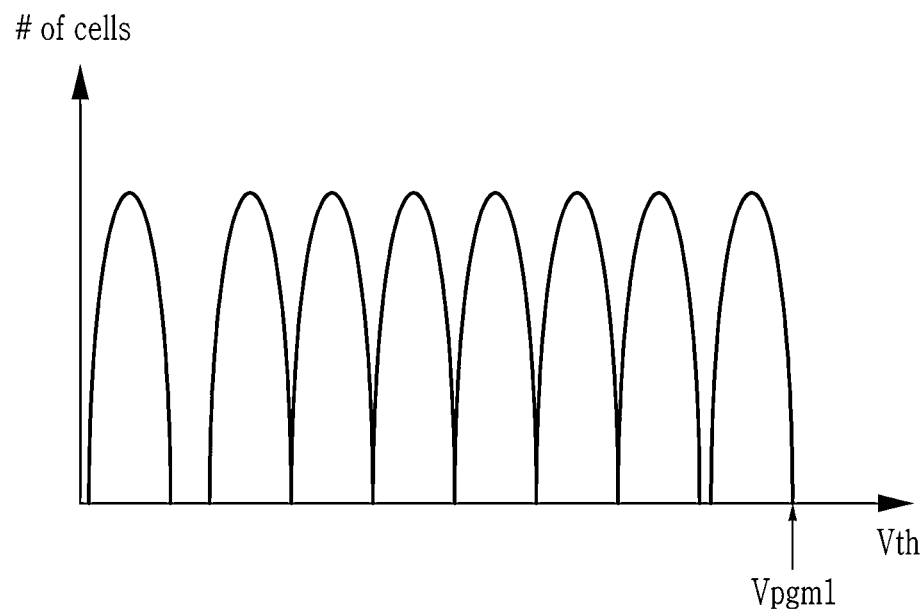
FIG. 12B is a threshold voltage distribution graph for describing operation of the memory device in a normal word line according to some example embodiments.
Figure 13A:
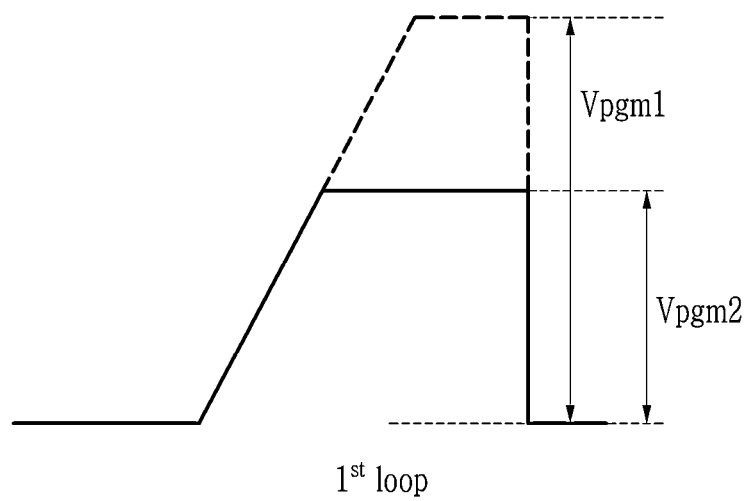
FIG. 13A is a program voltage graph for describing operation of the memory device in a bad word line and adjacent word lines according to some example embodiments.
Figure 13B:
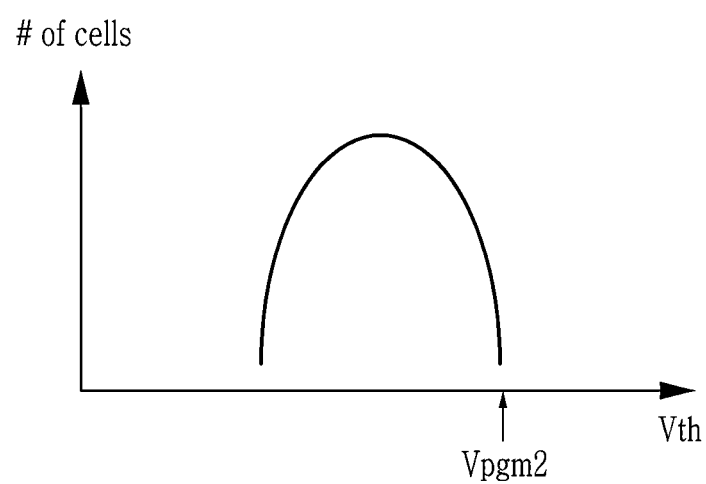
FIG. 13B a threshold voltage distribution graph for describing operation of the memory device in a bad word line and adjacent word lines.

FIG. 12A is a program voltage graph for describing operation of the memory device in a normal word line according to some example embodiments, FIG. 12B is a threshold voltage distribution graph for describing operation of the memory device in a normal word line according to some example embodiments, FIG. 13A is a program voltage graph for describing operation of the memory device in a bad word line and adjacent word lines according to some example embodiments, and FIG. 13B is a threshold voltage distribution graph for describing operation of the memory device in a bad word line and adjacent word lines.

Referring to FIG. 7, FIG. 12A, and FIG. 12B, a memory device may record data into normal word lines 740, 750, 760, and 770 with k-loop by using a signal with a waveform shown in FIG. 12A. That is, each memory cell of the memory device is a TLC cell type, and the memory device may record data in the TLC mode. However, the example embodiments are not necessarily limited thereto, and the memory cell may be implemented as a cell type such as MLC or QLC. As shown in FIG. 12A, program voltages may have a plurality of different voltage peak values. A voltage peak value Vpgm1 may be the highest among the plurality of voltage peak values. A threshold voltage distribution graph of the normal word lines 740, 750, 760, and 770 is as shown in FIG. 12B, and the voltage peak value Vpgm1 may be located on the rightmost side of the distribution graph.

Referring to FIG. 7, FIG. 13A, and FIG. 13B, the memory device may record data in a bad word line 710 and adjacent word lines 720 and 730 with 1-loop using the waveform shown in FIG. 13A. That is, the memory device may record data in the SLC mode for the bad word line 710 and the adjacent word lines 720 and 730. In the bad word line 710, dummy data is recorded and may be designated as a prohibited word line. Accordingly, reliability degradation of the adjacent word lines 720 and 730 can be prevented or hindered. The adjacent word lines 720 and 730 may be designated as read-only word lines in which user data is recorded. When a result of the defect detection shows that the adjacent word lines 720 and/or 730 is bad, dummy data may be recorded. As shown in FIG. 13A, a voltage peak value Vpgm2 of a program voltage corresponding to the dummy data may be lower than the voltage peak value Vpgm1. The threshold voltage distribution graph of the bad word line 710 and adjacent word lines 720 and 730 is as shown in FIG. 13B, and the voltage peak value Vpgm2 may be located on the rightmost side of the distribution graph. Since the voltage peak value Vpgm2 is lower than the voltage peak value Vpgm1, when comparing the threshold voltage distribution graph of FIG. 12B and FIG. 13B, a threshold voltage corresponding to the voltage peak value Vpgm2 on the x-axis may be positioned to the left than the threshold voltage corresponding to the voltage peak value Vpgm1. Accordingly, progressive degradation of the adjacent word lines 720 and 730 can be prevented or hindered, and the available capacity of the memory device can be increased.

Figure 14:
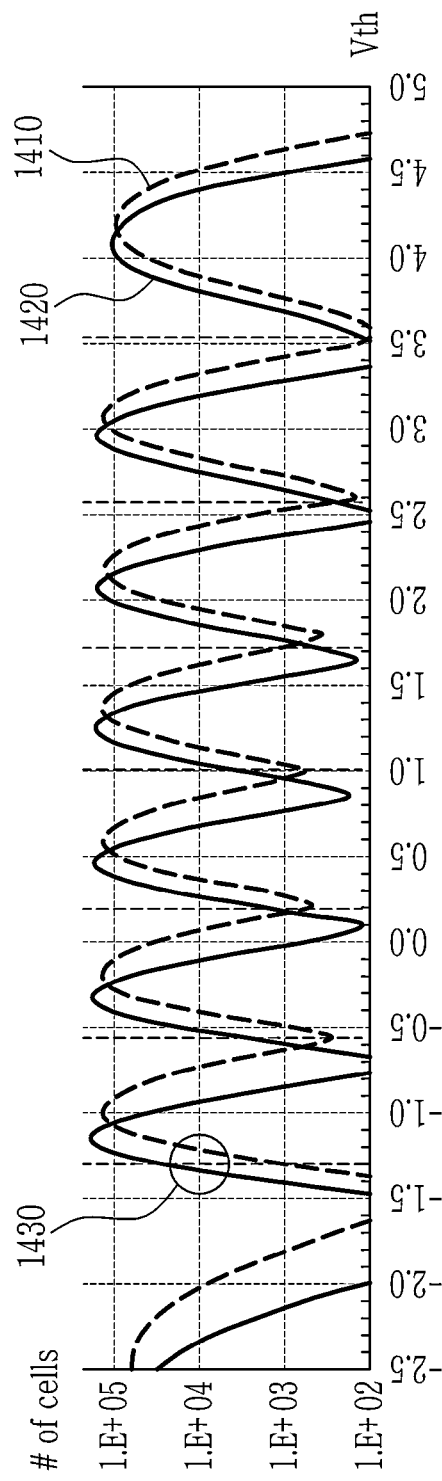
FIG. 14 is a graph for description of operation of the memory device according to some example embodiments.

FIG. 14 is a graph for description of operation of the memory device according to some example embodiments.

FIG. 14 shows threshold voltage distribution of the word line adjacent to the bad word line. A curve 1410 may represent the distribution of threshold voltages of normal word lines in which recording operations are normally performed. The recording operation may include sending information via a word line. If the word line is a bad word line, then no information or corrupted information may be received from the word line after sending the information via the word line. The curve 1420 may indicate the distribution of threshold voltages of adjacent word lines when no data is recorded to the bad word line and a recording operation is performed to a word line adjacent to the bad word line. Compared to the curve 1410, the curve 1420 has a voltage difference, and thus there may be reliability degradation. Accordingly, the memory device may record the dummy data in the bad word line such that the distribution of the word line adjacent to the bad word line may be as shown as the curve 1410. The memory device may record dummy data in a first-loop SLC mode.

Figure 15:
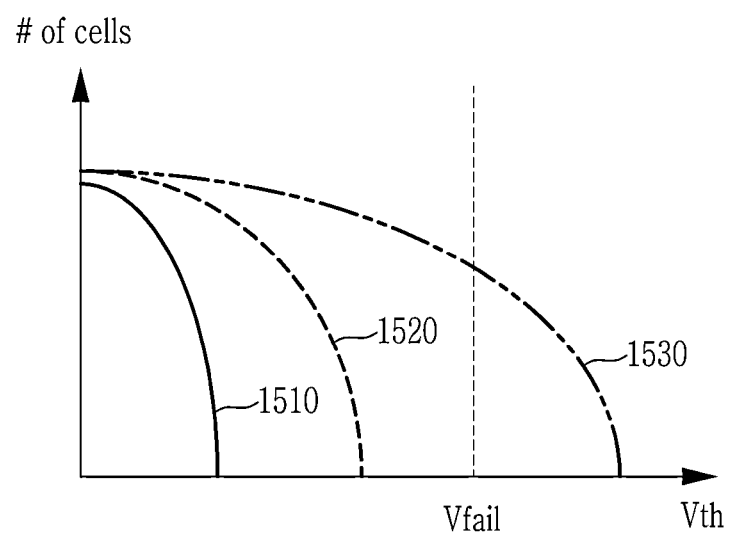
FIG. 15 is a graph for description of operation of the memory device according to some example embodiments.

FIG. 15 is a graph for description of operation of the memory device according to some example embodiments.

Referring to FIG. 15, it is possible to determine the distribution of the threshold voltage of a plurality of cells for each of or at least one of the normal word line, the bad word line, and the word line adjacent to the bad word line. A curve 1510 may represent a threshold voltage distribution of a plurality of cells connected to a normal word line. A curve 1520 may represent threshold voltage distribution of a plurality of cells connected to a word line adjacent to a bad word line. A curve 1530 may represent distribution of the threshold voltage of a plurality of cells connected to a word line adjacent to a bad word line. In the x-axis, a reference value Vfail may be a reference value for determining whether a word line is bad. The memory device designates not a bad word line but a word line adjacent to the bad word line as a prohibited word line in the block, and records data in the first-loop SLC mode using a seventh voltage, and may designate it as a read-only word line. The seventh voltage may be lower than the peak value of the voltage used to record data in the normal word line. That is, the usable word line may increase, and the available capacity of the memory device may increase.

Figure 16:
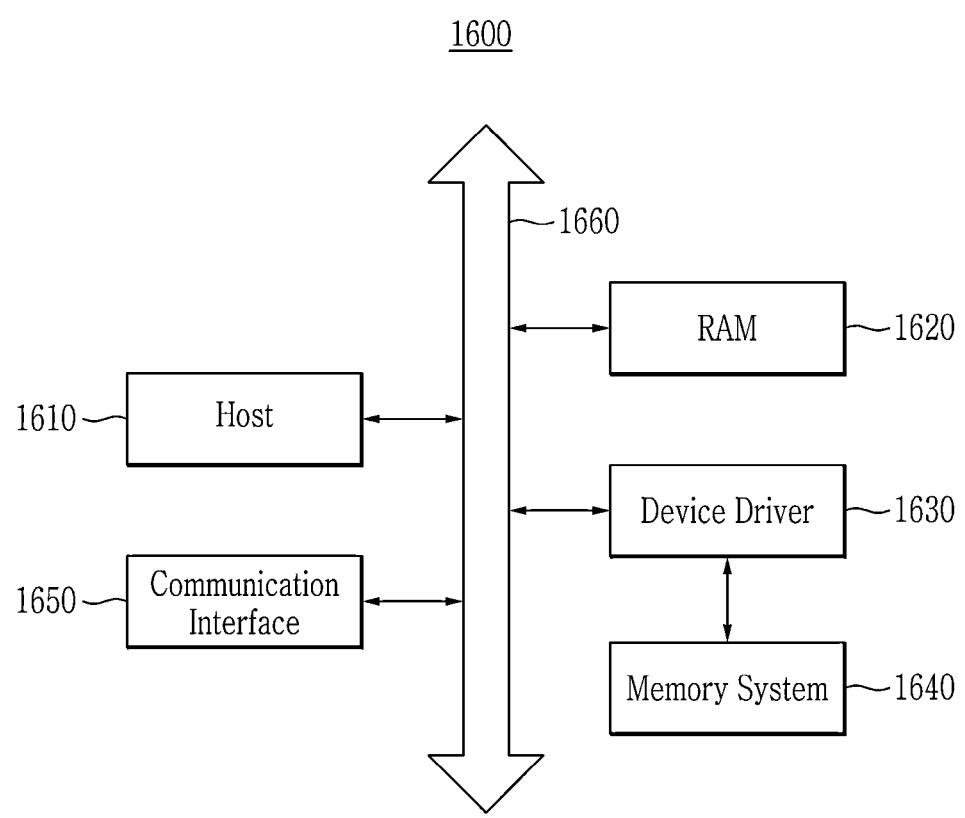
FIG. 16 is a schematic block diagram of a computing system according to some example embodiments.

FIG. 16 is a schematic block diagram of a computing system according to some example embodiments.

A computing system 1600 may be a mobile device or a computer. The computing system 1600 may include a host 1610, a RAM 1620, a device driver 1630, a memory system 1640, a communication interface 1650, and a bus 1660. The host 1610, the RAM 1620, the device driver 1630, the memory system 1640, and the communication interface 1650 may be electrically connected to the bus 1660, respectively. The computing system 1600 may further include constituent elements that are other generally-used constituent elements.

The host 1610 may control the overall operation of each constituent element of the computing system 1600. The host 1610 may be a central processing unit (CPU), a graphics processing unit (GPU), a microprocessor, or an application processor (AP).

The RAM 1620 may serve as data memory of the host 1610.

The host 1610 may record or read data to or from the memory system 1640 through the device driver 1630. The data may include dummy data and user data. In an example embodiment, the device driver 1630 may be implemented inside the host 1610.

The memory system 1640 may be implemented as a non-volatile memory. The memory system 1640 may include a memory controller and a memory device, and the memory system 1640 may be connected to the device driver 1630. The memory system 1640 may perform a function substantially equivalent to that of the memory system 10 of FIG. 1.

The bus 1660 may provide a communication function between constituent elements of the computing system 1600. The bus 1360 may include at least one type of bus according to a communication protocol between constituent elements.

In some example embodiments, a combination of constituent elements of each constituent element or two or more described with reference to FIG. 1 to FIG. 16 may be implemented as a digital circuit, a programmable or non-programmable logic device or array, an application specific integrated circuit (ASIC), and the like.

Example embodiments are not necessarily mutually exclusive. For example, some example embodiments may include one or more features described with reference to one or more figures, and may also include one or more other features described with reference to one or more other figures.

Any of the elements and/or functional blocks disclosed above may include or be implemented in processing circuitry such as hardware including logic circuits; a hardware/software combination such as a processor executing software; or a combination thereof. For example, the memory controller 200, control logic 150, and host 1610 may be implemented by processing circuitry which may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The processing circuitry may include electrical components such as at least one of transistors, resistors, capacitors, etc. The processing circuitry may include electrical components such as logic gates including at least one of AND gates, OR gates, NAND gates, NOT gates, etc.

Processor(s), controller(s), and/or processing circuitry may be configured to perform actions or steps by being specifically programmed to perform those action or steps (such as with an FPGA or ASIC) or may be configured to perform actions or steps by executing instructions received from a memory, or a combination thereof.

While the disclosure has been described in connection with example embodiments, it is to be understood that the inventive concepts are not limited to the disclosed example embodiments. On the contrary, it is intended to cover various modifications and equivalent arrangements included within the spirit and scope of the appended claims.

What is claimed is:

1. An operating method of a memory device, comprising:
   acquiring an address of a first bad word line, the first bad word line included in a plurality of word lines of the memory device;
   detecting whether word lines adjacent to the first bad word line are bad based on the address of the first bad word line, the word lines adjacent to the first bad word line included in the plurality of word lines;
   designating a first word line among the word lines adjacent to the first bad word line as a prohibited word line, the first word line being detected as a second bad word line; and
   sending first data via a second word line detected as a normal word line among the word lines adjacent to the first bad word line using a first voltage that is lower than a second voltage used to program normal word lines, the normal word lines being one or more of the plurality of word lines excluding the word lines adjacent to the first bad word line.

2. The operating method of the memory device of claim 1, further comprising:
   designating the second word line as a read-only word line.

3. The operating method of the memory device of claim 1, wherein
   the word lines adjacent to the first bad word line include n upper word lines and n lower word lines, the upper word lines being above the first bad word line, the lower word lines being below the first bad word line, and
   n is an integer greater than 0.

4. The operating method of the memory device of claim 1, wherein the designating the first word line as the prohibited word line comprises:
sending dummy data via the first word line, and designating the first word line as a prohibited word line.

5. The operating method of the memory device of claim 4, wherein
the sending the dummy data via the first word line and designating the first word line as the prohibited word line comprises sending the dummy data via the first word line in a single level cell (SLC) mode.

6. The operating method of the memory device of claim 1, further comprising:
sending dummy data via the first bad word line in an SLC mode.

7. The operating method of the memory device of claim 1, wherein the sending the first data via the second word line comprises:
sending the first data via the second word line using a first number of bits per cell which is less than a second number of bits per cell used for a first normal word line among the plurality of word lines.

8. The operating method of the memory device of claim 1, further comprising:
sending second data via one of the normal word lines excluding the word lines adjacent to the first bad word line using the second voltage.

9. The operating method of the memory device of claim 8, wherein the sending the second data using the second voltage comprises:
sending the second data in a mode corresponding to a cell type of the memory device, wherein
the cell type is one of a multi-level cell (MLC) type, a triple level cell (TLC) type, or a quad level cell (QLC) type, and
the mode is one of a MLC mode, a TLC mode, or a QLC mode.

10. The operating method of the memory device of claim 1, wherein the detecting whether the word lines adjacent to the first bad word line are bad comprises:
detecting whether a bridge occurs between each of the word lines adjacent to the first bad word line and a channel.

11. The operating method of the memory device of claim 1, wherein the detecting whether the word lines adjacent to the first bad word line are bad comprises:
measuring a leakage current at each of the word lines adjacent to the first bad word line; and
determining a word line adjacent to the first bad word line among the word lines adjacent to the first bad word line to be bad when the leakage current exceeds a reference value.

12. The operating method of the memory device of claim 1, wherein the plurality of word lines further comprise a third bad word line, and the operating method of the memory device further comprises:
designating n word lines between the first bad word line and the third bad word line as prohibited word lines, wherein n is an integer greater than 0.

13. The operating method of the memory device of claim 1, further comprising:
erasing a block including the plurality of word lines before the acquiring of the address of the first bad word line in the plurality of word lines.

14. An operating method of a memory device comprising:
acquiring an address of a first bad word line in a block;
sending first data via the first bad word line;
sending second data via a word line adjacent to the first bad word line; and
designating the first bad word line as a prohibited word line; and
designating the word line adjacent to the first bad word line as a read-only word line.

15. The operating method of the memory device of claim 14, wherein
the sending the first data via the first bad word line comprises sending the first data via the first bad word line in a first mode,
the sending the second data via the word line adjacent to the first bad word line comprises sending the second data via the word line adjacent to the first bad word line in a second mode, and
the first mode and the second mode use a first number of bits per cell, the first number of bits per cell being less than a second number of bits per cell used in a first normal word line, the first normal word line not being the word line adjacent to the first bad word line.

16. The operating method of the memory device of claim 14, wherein
the sending the first data via the first bad word line comprises sending the first data via the first bad word line in a single level cell (SLC) mode.

17. The operating method of the memory device of claim 14, wherein the sending the second data via the word line adjacent to the first bad word line comprises:
sending the second data via the word line adjacent to the first bad word line in a single level cell (SLC) mode or a multi-level cell (MLC) mode.

18. A memory system comprising:
a memory device including a plurality of memory cells respectively connected to a plurality of word lines; and
a memory controller configured to
acquire an address of a first bad word line in the plurality of word lines,
detect whether word lines adjacent to the first bad word line are bad based on the address of the first bad word line, the word lines adjacent to the first bad word line included in the plurality of word lines,
designate a first word line among the word lines adjacent to the first bad word line as a prohibited word line, the first word line being among the word lines adjacent to the first bad word line, the first word line being detected as a second bad word line, and
record first data in a second word line detected as a normal word line among the word lines adjacent to the first bad word line using a first voltage that is lower than a second voltage used to program normal word lines, the normal word lines being one or more of the plurality of word lines excluding the word lines adjacent to the first bad word line.

19. The memory system of claim 18, wherein
the memory controller is further configured to record dummy data in the first word line in a single level cell (SLC) mode, and designate the first word line as a prohibited word line.

20. The memory system of claim 18, wherein
the memory controller is further configured to record data in one of the normal word lines excluding the word lines adjacent to the first bad word line using the second voltage.

* * * * *